(12) United States Patent
Harada

(10) Patent No.: US 10,770,683 B2
(45) Date of Patent: Sep. 8, 2020

(54) ORGANIC EL DISPLAY PANEL AND MANUFACTURING METHOD THEREOF

(71) Applicant: JOLED INC., Tokyo (JP)

(72) Inventor: Kenji Harada, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/226,635

(22) Filed: Dec. 20, 2018

(65) Prior Publication Data

US 2019/0214598 A1 Jul. 11, 2019

(30) Foreign Application Priority Data

Jan. 11, 2018 (JP) .................................. 2018-002698

(51) Int. Cl.
| | | |
|---|---|---|
| *H01L 51/52* | (2006.01) | |
| *H01L 27/32* | (2006.01) | |
| *H01L 51/56* | (2006.01) | |
| *H01L 27/12* | (2006.01) | |

(52) U.S. Cl.
CPC ...... *H01L 51/5253* (2013.01); *H01L 27/3258* (2013.01); *H01L 51/5246* (2013.01); *H01L 51/56* (2013.01); *H01L 27/1248* (2013.01); *H01L 2227/323* (2013.01); *H01L 2251/5315* (2013.01); *H01L 2251/5338* (2013.01)

(58) Field of Classification Search
CPC . H01L 51/5253; H01L 51/5246; H01L 51/56; H01L 2227/323; H01L 27/3258; H01L 27/1248; H01L 2251/5315; H01L 2251/5338
See application file for complete search history.

(56) References Cited

U.S. PATENT DOCUMENTS

| | | |
|---|---|---|
| 2003/0164677 A1 | 9/2003 | Miyaguchi et al. |
| 2015/0207100 A1 | 7/2015 | Saito et al. |
| 2016/0365398 A1 | 12/2016 | Kim et al. |
| 2017/0280531 A1 | 9/2017 | Tada et al. |
| 2018/0226483 A1 | 8/2018 | Kim et al. |
| 2019/0363145 A1* | 11/2019 | Ohta .................... H01L 27/3276 |

FOREIGN PATENT DOCUMENTS

| | | |
|---|---|---|
| JP | H7-142170 A | 6/1995 |
| JP | 2000-223264 A | 8/2000 |
| JP | 2001-4837 A | 1/2001 |
| JP | 2009176756 A | 8/2009 |
| JP | 2011210540 A | 10/2011 |
| JP | 201444793 A | 3/2014 |
| JP | 201672127 A | 5/2016 |

* cited by examiner

*Primary Examiner* — Timor Karimy
(74) *Attorney, Agent, or Firm* — Hauptman Ham, LLP

(57) ABSTRACT

An organic electroluminescence (EL) display panel including: a substrate; an insulating resin layer extending from an image display region to a peripheral region; an organic EL element array within the image display region; a sealing layer extending from the image display region to the peripheral region; and a sealing reinforcement layer, laminated in this order. The sealing layer includes first, second, and third sealing layers laminated in this order from the substrate, the first and third sealing layers being made of an inorganic material and the second sealing layer being made of a resin. In the outer peripheral portion of the sealing layer, the first and third sealing layers are in direct contact with each other and cover an outer end of the insulating resin layer. An outer end of the sealing reinforcement layer is outside the outer end of the insulating resin layer in plan view.

5 Claims, 9 Drawing Sheets

ORGANIC EL DISPLAY PANEL AND MANUFACTURING METHOD THEREOF

This application claims priority to Japanese Patent Application No. 2018-002698 filed Jan. 11, 2018, the contents of which are hereby incorporated by reference in its entirety.

BACKGROUND

Technical Field

The present disclosure relates to organic electroluminescence (EL) display panels including a plurality of organic EL elements and a method of manufacturing such organic EL display panels, and in particular to a sealing technology for helping to suppress penetration of moisture from the surrounding environment.

Description of Related Art

Organic EL panels including a plurality of organic EL elements are conventionally known. An organic EL element has a multi-layered structure including a laminate of thin films of various materials, and includes at least a pixel electrode, a common electrode, and an organic light-emitting layer sandwiched between the pixel electrode and the common electrode on a thin film transistor (TFT) substrate covered by a planarization insulating layer. As necessary, a hole injection layer, a hole transport layer, an electron injection layer, an electron transport layer, or the like is disposed between the pixel electrode and the organic light-emitting layer or between the common electrode and the organic light-emitting layer.

These layers may include a material whose light-emitting quality deteriorates when reacting with moisture. In view of this, a sealing technology for suppressing penetration of moisture from the surrounding environment is important in order to suppress deterioration over time of display quality of organic EL display panels (for example, Japanese Patent Application Publication 2000-223264).

In recent years, organic EL display panels are expected to be used in various fields, and further improvement of their flexibility is desired.

In order to achieve this, thinning of a sealing layer, which is relatively thick among the layers in an organic EL display panel, is required. Accordingly, an organic EL display panel having a sealing structure that can secure a sufficient sealing property even with a thin sealing layer is desired.

SUMMARY

An organic EL display panel pertaining to at least one embodiment of the present disclosure is an organic EL display panel having an image display region and a peripheral region around the image display region in plan view. The organic EL display panel includes a substrate. The organic EL display panel further includes an insulating resin layer disposed above the substrate and extending from the image display region to the peripheral region. The organic EL display panel further includes an organic EL element array disposed above the insulating resin layer within the image display region. The organic EL display panel further includes a sealing layer disposed above the organic EL element array and extending from the image display region to the peripheral region. The organic EL display panel further includes a sealing reinforcement layer laminated above the sealing layer. In the organic EL display panel, the sealing layer includes a first sealing layer, a second sealing layer, and a third sealing layer that are laminated in this order from the substrate, the first sealing layer and the third sealing layer each being made of an inorganic material and the second sealing layer being made of a resin. In the organic EL display panel, in an outer peripheral portion of the sealing layer, the first sealing layer and the third sealing layer are in direct contact with each other without the second sealing layer disposed therebetween and extend to cover an outer end of the insulating resin layer. In the organic EL display panel, an outer end of the sealing reinforcement layer is located outside the outer end of the insulating resin layer in plan view.

Further, an organic EL display panel manufacturing method pertaining to at least one embodiment of the present disclosure is a method of manufacturing an organic EL display panel having an image display region and a peripheral region around the image display region in plan view. The method includes preparing a substrate. The method further includes forming an insulating resin layer above the substrate such that the insulating resin layer extends from the image display region to the peripheral region. The method further includes forming an organic EL element array above the insulating resin layer within the image display region. The method further includes forming a sealing layer above the organic EL element array such that the sealing layer extends from the image display region to the peripheral region. The method further includes laminating a sealing reinforcement layer above the sealing layer. In the method, the sealing layer includes a first sealing layer, a second sealing layer, and a third sealing layer that are laminated in this order from the substrate, the first sealing layer and the third sealing layer each being made of an inorganic material and the second sealing layer being made of a resin. In the method, in an outer peripheral portion of the sealing layer, the first sealing layer and the third sealing layer are directly laminated with each other without the second sealing layer disposed therebetween and extend to cover an outer end of the insulating resin layer. In the method, an outer end of the sealing reinforcement layer is located outside the outer end of the insulating resin layer in plan view.

BRIEF DESCRIPTION OF THE DRAWINGS

These and other objects, advantages, and features of the technology pertaining to the present disclosure will become apparent from the following description thereof taken in conjunction with the accompanying drawings, which illustrate at least one embodiment of the technology pertaining to the present disclosure.

DETAILED DESCRIPTION

<<Circumstances Leading to Embodiments of Present Disclosure>>

The inventor of the present disclosure has iterated improvement of sealing structures of organic EL display panels.

Figure 9:
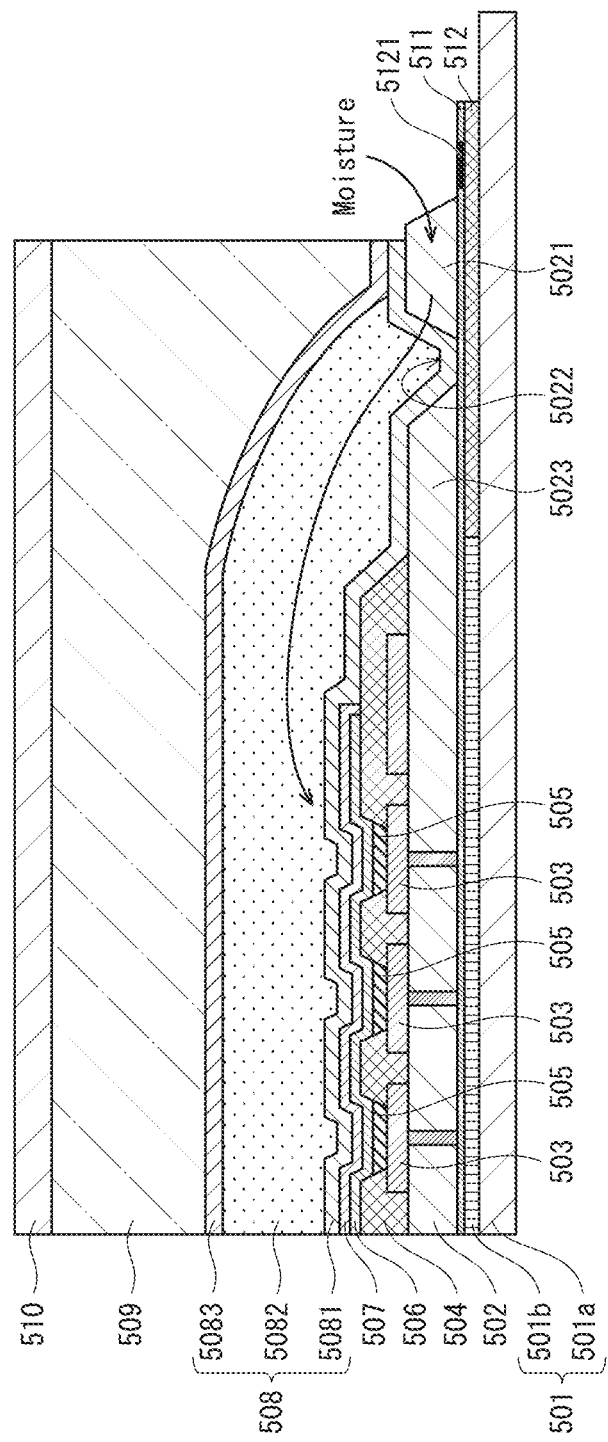
FIG. 9 is a schematic cross-sectional view of an example of a laminate structure of an organic EL display panel that the inventor of the present disclosure is developing.

FIG. 9 is a schematic cross-sectional view of an example of a laminate structure of an organic EL display panel that the inventor of the present disclosure is developing.

In FIG. 9, the organic EL display panel includes a substrate 501, a planarization insulating layer 502, pixel electrodes 503, a bank layer 504, light-emitting layers 505, an electron transport layer 506, a counter electrode 507, a sealing layer 508, a passivation film 511, and a wiring layer 512. A sheet-like base (sheet base) 510 is joined to the sealing layer 508 through a joining layer 509.

The substrate 501 includes a base member 501a and a TFT layer 501b disposed on the base member 501a.

The sealing layer 508 has a three-layered structure in which a first sealing layer 5081 made of silicon nitride (SiN), a second sealing layer 5082 made of a resin, and a third sealing layer 5083 made of silicon nitride are laminated. This structure helps to improve a durability and a moisture repellency of the sealing layer 508.

Through joining the sheet base 510 to the sealing layer 508 through the joining layer 509, the durability and moisture repellency can be further improved.

Note that the planarization insulating layer 502 has a groove 5022 in proximity of an outer end of the planarization insulating layer 502 and the planarization insulating layer 502 is divided into an inner insulating layer 5023 and an outer insulating layer 5021 by the groove 5022.

When forming the second sealing layer 5082 of the scaling layer 508 through a wet process, a resin that is a material of the second sealing layer 5082 has fluidity at the time point of application, and therefore may spread up to positions of connection terminals 5121 for connection to an external drive circuit. However, the groove 5022 prevents the resin material that is applied to form the second sealing layer 5082 from spreading at the outer insulating layer 5021.

However, for further flexibility improvement, thinning of the scaling layer 508, which is relatively thick among the layers in the organic EL display panel, is essential. However, if, specifically, the first sealing layer 5081 and the third sealing layer 5083 in the sealing layer 508, which are made of silicon nitride, have smaller film thicknesses, one or more pinholes may appear easily when forming the first sealing layer 5081 and the third sealing layer 5083 because of impurities or the like. This may cause a sealing flaw.

Specifically, in the structure in FIG. 9, an outer peripheral portion of the outer insulating layer 5021, which is made of resin, is exposed to an external environment. Accordingly, as expressed by the arrows in FIG. 9, moisture in the environment may be absorbed into the outer insulating layer 5021, penetrate through a pinhole in the first sealing layer 5081 into the second sealing layer 5082, and further through another pinhole in the first sealing layer 5081 into the organic EL elements. This moisture penetration may cause deterioration of the cathode 507 and the light-emitting layers 505 and an early decline of light-emitting efficiency of the organic EL panel.

The inventor arrived at embodiments of the present disclosure so as to secure a sufficient sealing property even when the thickness of the organic EL display panel is made thin in order to further improve flexibility.

<<Overview>>

An organic EL display panel pertaining to at least one embodiment of the present disclosure is an organic EL display panel having an image display region and a peripheral region around the image display region in plan view. The organic EL display panel includes a substrate. The organic EL display panel further includes an insulating resin layer disposed above the substrate and extending from the image display region to the peripheral region. The organic EL display panel further includes an organic EL element array disposed above the insulating resin layer within the image display region. The organic EL display panel further includes a sealing layer disposed above the organic EL element array and extending from the image display region to the peripheral region. The organic EL display panel further includes a sealing reinforcement layer laminated above the sealing layer. In the organic EL display panel, the sealing layer includes a first sealing layer, a second sealing layer, and a third sealing layer that are laminated in this order from the substrate, the first sealing layer and the third sealing layer each being made of an inorganic material and the second sealing layer being made of a resin. In the organic EL display panel, in an outer peripheral portion of the sealing layer, the first sealing layer and the third sealing layer are in direct contact with each other without the second sealing layer disposed therebetween and extend to cover an outer end of the insulating resin layer. In the organic EL display panel, an outer end of the sealing reinforcement layer is located outside the outer end of the insulating resin layer in plan view.

Due to this structure, moisture in the environment would not penetrate inside easily even when the sealing layer is made thin for flexibility improvement. This helps to prevent deterioration of the organic EL elements.

According to an organic EL display panel pertaining to at least one embodiment of the present disclosure, the sealing reinforcement layer includes a sheet-like base and a joining layer through which the sheet-like base is joined to the sealing layer.

By joining the sheet-like base to the scaling layer through the joining layer as described above, a sealing property of the sealing layer is reinforced.

According to an organic EL display panel pertaining to at least one embodiment of the present disclosure, the sealing reinforcement layer includes a sheet-like base, a joining layer through which the sheet-like base is joined to the sealing layer, and a protection member that covers an outer end of the joining layer and an outer end of the sheet-like base.

Covering the outer ends of the joining layer and the sheet-like base with the protection member as described above helps to suppress moisture penetration from the outer ends of the joining layer and the sheet-like base and helps to improve the sealing property.

According to an organic EL display panel pertaining to at least one embodiment of the present disclosure, the protection member is made of an ultraviolet-curing resin material or a thermosetting resin material.

Due to this, the protection member can be cured immediately even when the protection member is formed through an application process.

According to an organic EL display panel pertaining to at least one embodiment of the present disclosure, in plan view, outer ends of the first sealing layer and the third sealing layer coincide with the outer end of the sealing reinforcement layer.

Due to this structure, the sealing reinforcement layer can be used as an etching mask during manufacture of the organic EL display panel. This helps reduction of manufacture costs.

According to an organic EL display panel pertaining to at least one embodiment of the present disclosure, the insulating resin layer has, in the peripheral region, a groove that surrounds the organic EL element array, the insulating resin layer being divided into an inner insulating resin layer portion and an outer insulating resin layer portion by the groove, the first sealing layer covering side surfaces and a bottom of the groove and the outer insulating resin layer portion.

Due to this structure, even when moisture penetrates from an outer end of the interlayer insulating layer, the groove helps to prevent the moisture from penetrating into the image display region in which the organic EL elements are arranged.

Further, an organic EL display panel manufacturing method pertaining to at least one embodiment of the present disclosure is a method of manufacturing an organic EL display panel having an image display region and a peripheral region around the image display region in plan view. The method includes preparing a substrate. The method further includes forming an insulating resin layer above the substrate such that the insulating resin layer extends from the image display region to the peripheral region. The method further includes forming an organic EL element array above the insulating resin layer within the image display region. The method further includes forming a sealing layer above the organic EL element array such that the sealing layer extends from the image display region to the peripheral region. The method further includes laminating a sealing reinforcement layer above the sealing layer. In the method, the sealing layer includes a first sealing layer, a second sealing layer, and a third sealing layer that are laminated in this order from the substrate, the first sealing layer and the third sealing layer each being made of an inorganic material and the second sealing layer being made of a resin. In the method, in an outer peripheral portion of the sealing layer, the first sealing layer and the third sealing layer are directly laminated with each other without the second sealing layer disposed therebetween and extend to cover an outer end of the insulating resin layer. In the method, an outer end of the sealing reinforcement layer is located outside the outer end of the insulating resin layer in plan view.

According to an organic EL display panel manufacturing method pertaining to at least one embodiment of the present disclosure, the laminating of the sealing reinforcement layer includes joining a sheet-like base to the sealing layer through a joining layer.

According to an organic EL display panel manufacturing method pertaining to at least one embodiment of the present disclosure, the laminating of the sealing reinforcement layer includes joining a sheet-like base to the sealing layer through a joining layer and covering an outer end of the joining layer and an outer end of the sheet-like base with a protection member.

According to an organic EL display panel manufacturing method pertaining to at least one embodiment of the present disclosure, the protection member is formed through applying an ultraviolet-curing resin material or a thermosetting resin material.

According to an organic EL display panel manufacturing method pertaining to at least one embodiment of the present disclosure, the forming of the insulating resin layer includes forming a groove in the peripheral region such that the groove surrounds the organic EL element array and the insulating resin layer is divided into an inner insulating resin layer portion and an outer insulating resin layer portion by the groove.

An organic EL display panel manufacturing method pertaining to at least one embodiment of the present disclosure further includes, after the laminating of the sealing reinforcement layer, removing unnecessary portions of an outer peripheral portion of the first sealing layer and an outer peripheral portion of the third sealing layer through reactive-ion etching while using the sealing reinforcement layer as a mask.

Through the above manufacturing method, an organic EL display panel having effects similar to the effects of the organic EL display panel described above can be manufactured.

First Embodiment

The following describes an embodiment of an organic EL display panel pertaining to the present disclosure, taking a flexible top-emission type organic EL display panel as an example.

1. Structure of Display Panel 1.1. Overview of Structure

Figure 1:
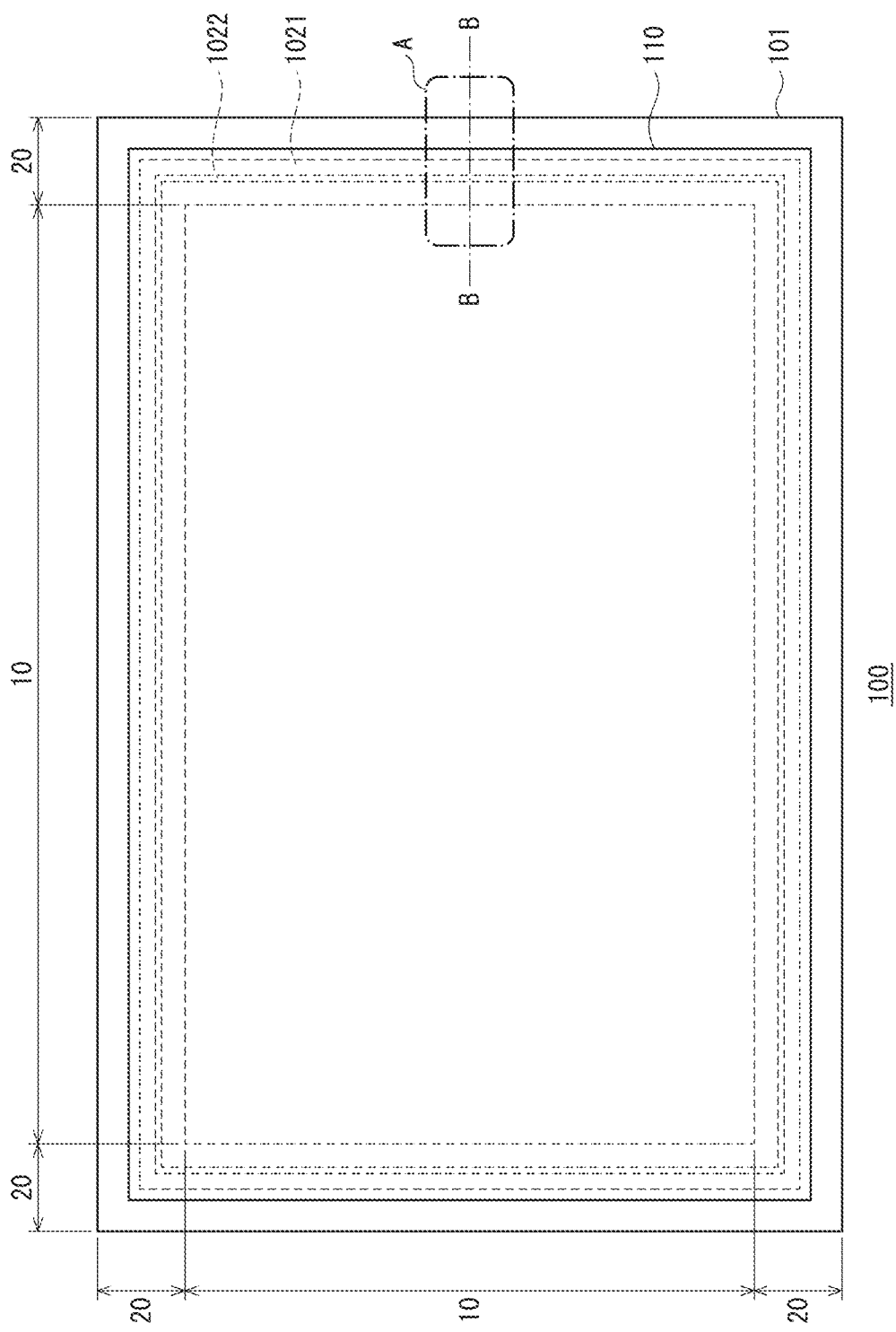
FIG. 1 is a layout in plan view of an organic EL display panel pertaining to at least one embodiment.

FIG. 1 is a layout in plan view of an organic EL display panel 100 pertaining to at least one embodiment.

In FIG. 1, in plan view, the organic EL display panel 100 has an image display region 10 and a peripheral region 20 surrounding the image display region 10.

In the image display region 10, a plurality of pixels are arrayed in a matrix. The pixels each include a plurality of subpixels of different colors. In the present embodiment, the pixels each include a red subpixel, a green subpixel, and a blue subpixel. Each subpixel corresponds to an organic EL element. The organic EL elements that are arrayed in a matrix are hereinafter referred to as an organic EL element array.

In the peripheral region 20, a plurality of terminals (not illustrated) for electrically connecting to an external drive circuit are disposed.

1.2 Laminate Structure of Organic EL Display Panel 100

Figure 2:
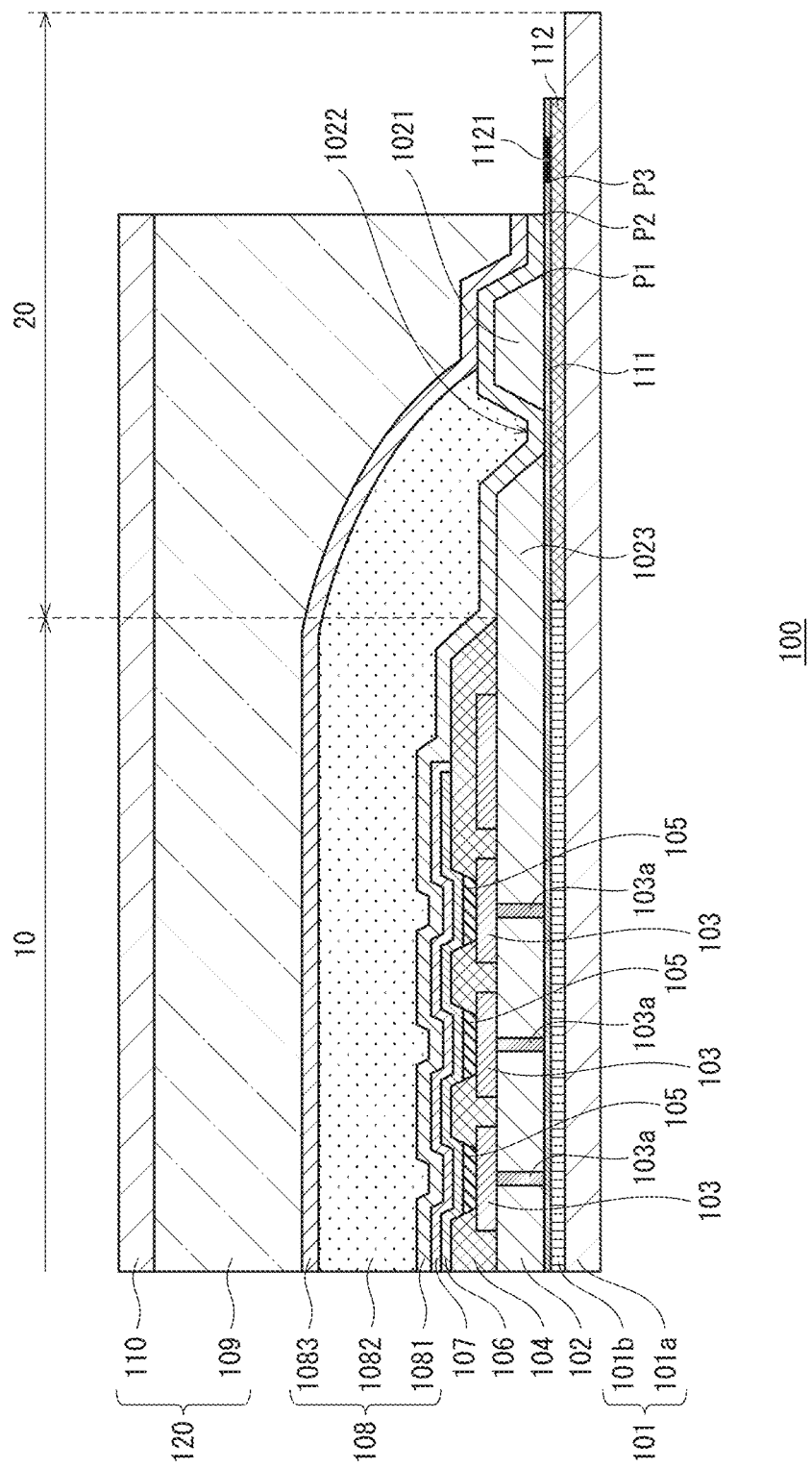
FIG. 2 is a schematic cross-sectional view of a laminate structure of the organic EL display panel pertaining to at least one embodiment, taken along line B-B in a region A of FIG. 1.

FIG. 2 is a partial cross-sectional view of an overall structure of the organic EL display panel 100 pertaining to at least one embodiment, taken along line B-B in a region A of FIG. 1.

In FIG. 2, the organic EL display panel 100 includes a substrate 101, an interlayer insulating layer (insulating resin layer) 102, pixel electrodes 103, a bank layer 104, light-emitting layers 105, an electron transport layer 106, a counter electrode 107, a sealing layer 108, a sealing reinforcement layer 120, a passivation film 111, and a wiring layer 112. Among these layers, the pixel electrodes 103 and the light-emitting layers 105 correspond one-to-one with the subpixels.

<Substrate>

The substrate 101 includes a base member 101a that is made of an electrically-insulating material and a thin film transistor (TFT) layer 101b. The TFT layer 101b includes known drive circuits that each include a TFT and that correspond one-to-one with the pixels.

In the present embodiment, it is beneficial that the base member 101a be made of an electrically-insulating resin material in order to secure flexibility. For the resin material, a thermoplastic resin or a thermosetting resin may be used. For example, polyethylene; polypropylene; polyamide; polyimide (PI); polycarbonate; an acrylic resin; polyethylene terephthalate (PET); polybutylene terephthalate; polyacetal; other fluorine-based resins; thermoplastic elastomer such as styrenic elastomer, polyolefin elastomer, polyvinyl chloride elastomer, polyurethane elastomer, fluorine rubber elastomer, and chlorinated polyethylene elastomer; an epoxy resin; an unsaturated polyester; a silicone resin; polyurethane, or the like, or copolymer, blend, polymer alloy or the like mainly including such a material, primarily consisting of one of the above, or a layered body including layers of one or more of the above can be used.

<Wiring Layer>

The wiring layer 112 includes a plurality of wires extending from the TFT layer 101b. The wires are spaced away from each other and are made of, for example, an electrically-conductive material such as a metal like chromium (Cr), molybdenum (Mo), aluminum (Al), titanium (Ti), copper (Cu), or the like, an alloy (such as a molybdenum tungsten alloy (MoW), a molybdenum chromium alloy (MoCr), a nickel chromium alloy (NiCr)), or the like.

<Passivation Film>

The passivation film 111 is a protective film that covers the TFT layer 101b and the wiring layer 112, and is made of silicon nitride (SiN), silicon oxide (SiO), silicon oxynitride (SiON), or the like. The connection terminals 1121, which are extended from the wiring layer 112, are exposed from the passivation film 111 in the peripheral region 20, and are connected to the external drive circuit (not illustrated).

<Interlayer Insulating Layer>

The interlayer insulating layer (insulating resin layer) 102 is disposed above the substrate 101. The interlayer insulating layer 102 is made of an electrically-insulating resin material and planarizes unevenness of an upper surface of the passivation film 111 that is disposed on the TFT layer 101b. Examples of such an electrically-insulating resin material are an acrylic resin, a polyimide resin, a siloxane resin, and a phenolic resin.

In the peripheral region 20 of the interlayer insulating layer 102, a groove (hereinafter referred to as "peripheral groove") 1022 extends in parallel with an outer end of the interlayer insulating layer 102 (see FIG. 1). The interlayer insulating layer 102 is divided completely into an inner insulating layer 1023 and an outer insulating layer 1021 by the peripheral groove 1022, and the passivation film 111 is exposed at a bottom of the peripheral groove 1022.

The peripheral groove 1022 from which the interlayer insulating layer 102 is removed beneficially has a width from 50 μm to 800 μm, and more beneficially has a width from 400 μm to 600 μm.

As described above, the interlayer insulating layer 102 is made of an electrically-insulating material such as a polyimide resin, an acrylic resin, or the like, and absorbs moisture easily. However, the peripheral groove 1022 helps to prevent moisture penetration into the display region 10 even when moisture penetrates from a substrate outer peripheral direction into the outer insulating layer 1021, which is outside the peripheral groove 1022.

Further, when a second sealing layer 1082 of the sealing layer 108 is formed through a wet process, a resin that is a material of the second sealing layer 1082 has fluidity at the time point of application, and therefore there is a risk that the resin could spread up to the positions of the connection terminals 1121, which are provided for external connection. However, the peripheral groove 1022 functioning as a "moat" and the outer insulating layer 1021 functioning as a "dam" help to prevent the resin material that is applied to form the second sealing layer 1082 from spreading at the outer insulating layer 1021.

<Pixel Electrodes>

The pixel electrodes 103 include a metal layer made of a light-reflective metal material and are disposed on the interlayer insulating layer 102. The pixel electrodes 103 correspond one-to-one with the subpixels and are electrically connected through contact holes to the TIT layer 101b.

In the present embodiment, the pixel electrodes 103 function as anodes.

Specific examples of a metal material having light-reflectivity are silver (Ag); aluminum (Al); an aluminum alloy; molybdenum (Mo); a silver, palladium, and copper alloy (APC); a silver, rubidium, gold alloy (ARA); a molybdenum chromium alloy (MoCr); a molybdenum tungsten alloy (MoW); a nickel chromium alloy (NiCr), and the like.

The pixel electrodes 103 may each be a single metal layer or may each have a layered structure in which a layer made of a metal oxide such as indium tin oxide (ITO) or indium zinc oxide (IZO) is laminated on a metal layer.

<Bank Layer>

The bank layer 104 is disposed with portions of upper surfaces of the pixel electrodes 103 being exposed and regions around the exposed portions of the upper surfaces of the pixel electrodes 103 being covered by the bank layer 104.

Regions in the upper surfaces of the pixel electrodes 103 that are not covered by the bank layer 104 (hereinafter referred to as "openings") correspond one-to-one with the subpixels.

The bank layer 104 is made of, for example, an electrically-insulating organic material (such as an acrylic resin, a polyimide resin, a novolac resin, a phenolic resin, or the like). When the light-emitting layers 105 are formed through an application process, the bank layer 104 functions as a structure for preventing the applied ink from flowing out. When the light-emitting layers 105 are formed through vapor deposition, the bank layer 104 functions as a structure for placing a vapor deposition mask.

<Light-Emitting Layers>

The light-emitting layers 105 are in the openings of the bank layer 104 and each have a function of emitting light of one of the colors R, G, and B through recombination of holes and electrons.

For a material of the light-emitting layers 105, a known material can be used. Specifically, for example, the light-emitting layers 105 are beneficially made of a fluorescent substance such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group III metal, metal complex of oxine, or rare earth metal complex.

<Electron Transport Layer>

The electron transport layer 106 has a function of transporting electrons from the counter electrode 107 to the light-emitting layers 105. The electron transport layer 106 is made of, for example, an organic material having a high electron transport property. Specifically, the electron transport layer 106 is made of a nt electron system small-molecule organic material such as an oxadiazole derivative (OXD), a triazole derivative (TAZ), a phenanthroline derivative (BCP. Bphen), or the like. The electron transport layer 106 may be doped with a metal selected from alkali metals and alkaline earth metals. Alternatively, for example, the electron transport layer 106 may be made of a metal selected from alkali metals, alkaline earth metals, and fluorides of such metals.

<Counter Electrode>

The counter electrode 107 is made of a light-transmissive electrically-conductive material and is disposed on the electron transport layer 106. The counter electrode 107 functions as a cathode.

For a material of the counter electrode 107, for example, ITO or IZO can be used. Alternatively, for a material of the counter electrode 107, a thin film made by using a metal such as silver, a silver alloy, aluminum, an aluminum alloy, or the like may be used.

<Sealing Layer>

The sealing layer 108 has a function of preventing organic layers such as the light-emitting layers 105 and the electron transport layer 106 from being exposed to moisture, air, or the like.

The sealing layer 108 has a three-layered structure of a first sealing layer 1081, a second sealing layer 1082, and a third sealing layer 1083 that each have a light-transmittance.

The first sealing layer 1081 is a thin film of silicon nitride (SiN) and covers an upper surface of the counter electrode 107.

The second sealing layer 1082 is made of a resin and covers a portion of an upper surface of the first sealing layer 1081 other than a peripheral portion of the first sealing layer 1081. For a resin material of the second sealing layer 1082, for example, a fluorine-based resin, an acrylic resin, an epoxy resin, a silicone resin, or the like is used.

The third sealing layer 1083 is a thin film of silicon nitride similar to the first sealing layer 1081 and covers an upper surface of the second sealing layer 1082.

In the peripheral region 20, in plan view, the first sealing layer 1081 extends up to a position P2 that is outside a position of an outer end of the resin outer insulating layer 1021 (P1) and that is inside a position of the connection terminals 1121 (P3) and covers an entirety of surfaces of the outer insulating layer 1021 in the peripheral region 20 including the outer end of the outer insulating layer 1021. Note that a distance between the position P2 and the position P3 beneficially is a distance such that the joining layer 109 would not reach the connection terminals 1121 even if the joining layer 109 flows out to some extent when forming the sealing reinforcement layer 120 (approximately 600 μm in the present embodiment).

The second sealing layer 1082 is formed through applying a resin material on the first sealing layer 1081. However, the peripheral groove 1022 and the outer insulating layer 1021 prevent the resin material from spreading as described above, and therefore an outer end of the second sealing layer 1082 is located on a top surface of the outer insulating layer 1021 at a position close to the image display region 10.

The third sealing layer 1083 extends outside the outer insulating layer 1021, and an outer end of the third sealing layer 1083 coincides with an outer end of the first sealing layer 1081. Thus, an outer peripheral portion of the first sealing layer 1081 and an outer peripheral portion of the third sealing layer 1083 come into close contact with each other without the second sealing layer 1082 disposed therebetween.

This helps to prevent moisture from penetrating from outside and directly into the interlayer insulating layer 102 and the second sealing layer 1082 and consequently helps to improve a sealing property of the sealing layer 108.

<Sealing Reinforcement Layer>

The sealing reinforcement layer 120 reinforces the property of the above-described sealing layer 108 of sealing the organic EL display panel 100. In the present embodiment, the sealing reinforcement layer 120 includes a sheet-like base member 110 (hereinafter referred to as the sheet base) and a joining layer 109 for joining the sheet base 110 to the sealing layer 108.

The organic EL display panel 100 is a top-emission type of panel, and therefore the sheet base 110 is made by using, for example, a light-transmissive material such as a transparent resin film. The joining layer 109 is formed in advance on one of main surfaces of the sheet base 110, and during manufacturing processes of the organic EL display panel 100, the sheet base 110 is positioned relative to the above-described sealing layer 108 and joined to the sealing layer 108.

For a material of the joining layer 109, for example, an acrylic resin having a light-transmittance is used.

The sealing reinforcement layer 120 further helps to prevent external moisture, air, or the like from penetrating into the organic EL display panel 100.

2. Organic EL Display Panel Manufacturing Method

The following describes a method of manufacturing the organic EL display panel 100, with reference to the drawings.

Figure 3:
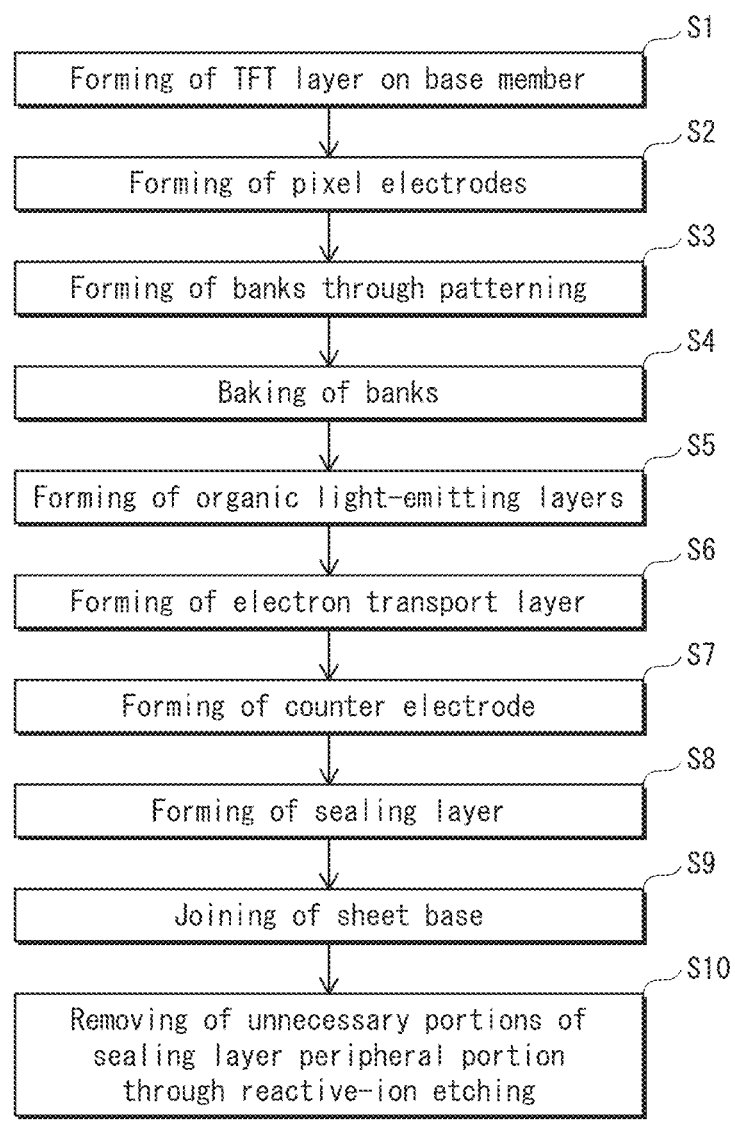
FIG. 3 is a flowchart of processes of manufacturing the organic EL display panel pertaining to at least one embodiment.

FIG. 3 is a flowchart of processes of manufacturing the organic EL display panel 100 pertaining to at least one embodiment.

(1) Forming Substrate 101

First, the substrate 101 is formed through forming the TFT layer 101b and the wiring layer 112 on the base member 101a (step S1) through a known TFT manufacturing method.

Further, the passivation film 111 is formed on the TFT layer 101b. The passivation film 111 is made of silicon nitride (SiN), silicon oxide (SiO), silicon oxynitride (SiON), or the like, and protects the TFT layer 101b and the wiring layer 112 from impurities included in the interlayer insulating layer 102 and the bank layer 104. The passivation film 111 is formed through, for example, plasma-enhanced chemical vapor deposition (PECVD), sputtering, or the like.

Then, the interlayer insulating layer 102 is formed on the passivation film 111 through, for example, PECVD, sputtering, or the like.

Then, portions of the interlayer insulating layer 102 and the passivation film 111 on source electrodes of the TFT layer 101b are dry-etched to form the contact holes. The contact holes are formed such that, for example, surfaces of the source electrodes are exposed at the bottom of the contact holes.

Further, similarly through dry-etching, the peripheral groove 1022 is formed at a peripheral portion of the interlayer insulating layer 102 to divide the interlayer insulating layer 102 into the outer insulating layer 1021 and the inner insulating layer 1023. The dry-etching is performed until the interlayer insulating layer 102 is not present at the bottom of the peripheral groove 1022 and the upper surface of the passivation film 111 is exposed at the bottom of the peripheral groove 1022.

Next, connection electrodes 103a are formed along inner walls of the contact holes. Upper portions of the connection electrodes 103a are partially over the interlayer insulating layer 102 and the passivation film 111. The connection electrodes 103a are formed through, for example, sputtering. Specifically, the connection electrodes 103a are formed through forming a metal film and patterning the metal film by photolithography and wet-etching.

The connection terminals 1121 may be formed through processes similar to the processes described above. That is, through forming openings at defined positions of the passivation film 111 in the peripheral region 20 by dry-etching, forming a metal film by sputtering or the like, and patterning the metal film by photolithography and wet-etching, the connection terminals 1121 are formed in the passivation film 111 such that the connection terminals 1121 are connected to the wires in the wiring layer 112 below the connection terminals 1121.

Note that the interlayer insulating layer 102 may be formed through a known photoresist process.

(2) Forming Pixel Electrodes 103

Next, a pixel electrode material layer is formed on the interlayer insulating layer 102 through, for example, vacuum vapor deposition or sputtering.

Next, the pixel electrode material layer is patterned through etching to form a plurality of pixel electrodes 103 that are separated to correspond one-to-one with the subpixels (step S2).

(3) Forming Bank Layer 104

Next, a bank material layer is formed through applying, on the pixel electrodes 103 and the interlayer insulating layer 102, a bank layer resin that is a material of the bank layer 104.

The bank material layer is formed through obtaining a solution by dissolving a phenolic resin that is the bank layer resin into a solvent (such as a mixed solvent of ethyl lactate and γ-Butyrolactone (GBL)) and uniformly applying the solution on the pixel electrodes 103 and the interlayer insulating layer 102 through spin coating or the like. Then, the bank layer 104 is formed through applying pattern exposure and developing to the bank material layer (step S3), and the bank layer 104 is baked (step S4). Due to this, the openings, which are regions in which the light-emitting layers 105 are formed, are defined. Baking of the bank layer 104 is performed, for example, for sixty minutes at a temperature from 150° C. 15 to 210° C.

Further, in the process of forming the bank layer 104, a surface of the bank layer 104 may be treated by using a defined liquid such as an alkaline solution, water, an organic solvent, or the like, or through applying a plasma treatment. This is performed for the purpose of adjusting the angle of contact between the bank layer 104 and ink (solution) to be applied to the openings or for the purpose of providing the surface of the bank layer 104 with moisture repellency.

(4) Forming Light-Emitting Layers 105

Next, ink including a component material of the light-emitting layers 105 is applied to the openings, which are defined by the bank layer 104, by using an inkjet device and drying (baking) is performed to form the light-emitting layers 105 (step S5). Alternatively, the application can be performed through dispensing, screen printing, or the like.

(5) Forming Electron Transport Layer 106

Next, the electron transport layer 106 is formed on the light-emitting layer 105 and the bank layer 104 (step S6) through, for example, vapor deposition such that the electron transport layer 106 spans over the subpixels.

(6) Forming Counter Electrode 107

Next, the counter electrode 107 is formed on the electron transport layer 106 (step S7) through, for example, forming a film of ITO, IZO, silver, aluminum, or the like through sputtering or vacuum vapor deposition.

(7) Forming Sealing Layer 108

The sealing layer 108 is formed on the counter electrode 107 (step S8).

Figure 4A:
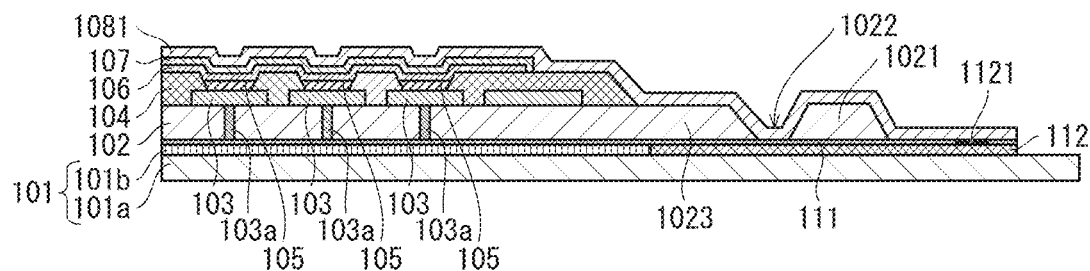
FIG. 4A, FIG. 4B, and FIG. 4C are schematic cross-sectional views for describing processes of forming the organic EL display panel pertaining to at least one embodiment.

First, the first sealing layer 1081, which is made of SiN, is formed through, for example, PECVD (FIG. 4A). For example, silane ($SiH_4$) and ammonia ($NH_3$) are used as gas for forming the first sealing layer 1081. Nitrogen ($N_2$) may additionally be used.

The outer peripheral portion of the first sealing layer 1081 extends outside relative to the outer end of the outer insulating layer 1021 in the peripheral region 20. Here, the first sealing layer 1081 is in direct contact with the passivation film 111 at portions in the bottom of the peripheral groove 1022 and at portions outside the outer insulating layer 1021.

Figure 4B:
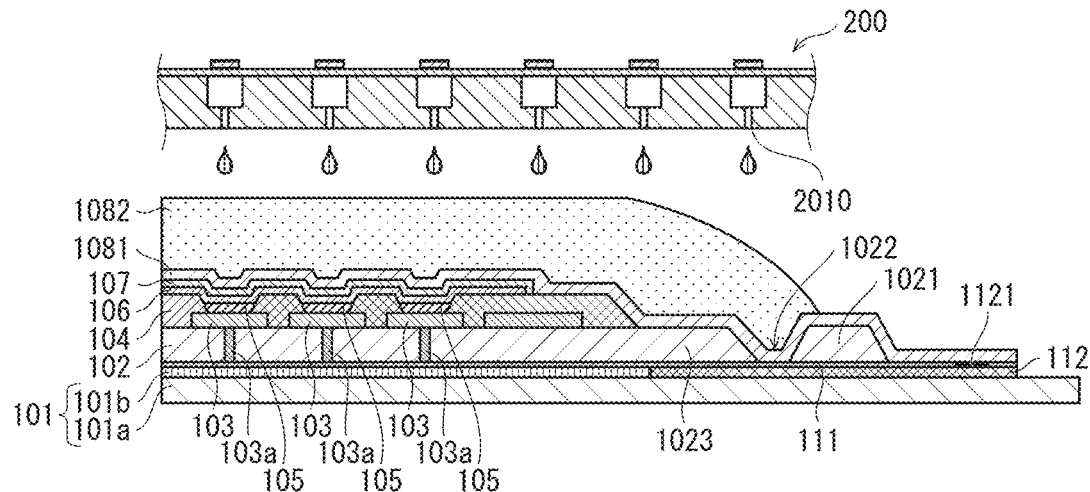

Next, the second sealing layer 1082 is formed through ejecting a resin material from a nozzle 2010 of a head portion 200 of an inkjet device onto the first sealing layer 1081 (FIG. 4B) and curing the resin material. For example, the resin material is cured through heating when the resin material has a thermosetting property; alternatively, the resin material is cured through ultraviolet irradiation when the resin material has an ultraviolet-curing property.

Note that the resin material can be applied through screen printing, dispensing, or the like as an alternative to an inkjet process described above.

Figure 4C:
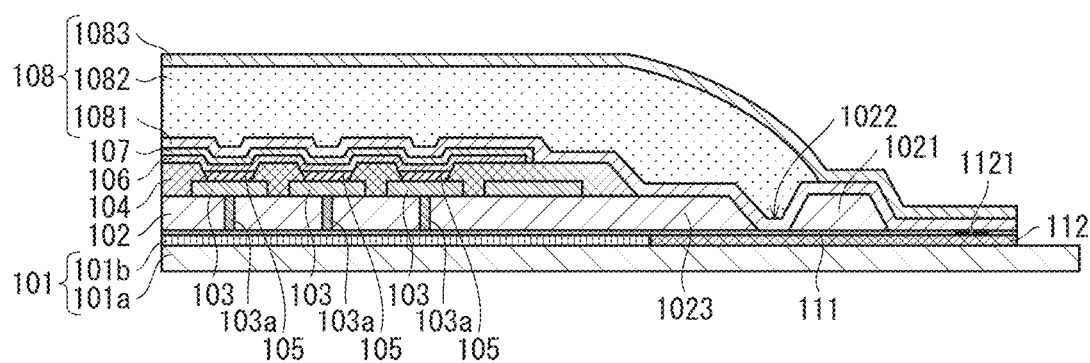

The third sealing layer 1083 is formed on the second sealing layer 1082 by using the same film-forming conditions as the first sealing layer 1081 (FIG. 4C).

As described above, the outer end of the second sealing layer 1082 is located above the outer insulating layer 1021 due to a damming function of the peripheral groove 1022 and the outer insulating layer 1021, and the first sealing layer 1081 and the third sealing layer 1083 extend outside the outer insulating layer 1021 in plan view. Accordingly, the outer peripheral portion of the first sealing layer 1081 and the outer peripheral portion of the third sealing layer 1083 are in direct contact with each other without the second sealing layer 1082 disposed therebetween. The resin of the second sealing layer 1082 would not be exposed to the outside, and therefore moisture or the like in the environment does not penetrate into the second sealing layer 1082 easily.

(8) Joining Sheet Base 110 (Forming Sheet Reinforcement Layer 120)

In the present embodiment, the sheet base 110 is a transparent resin film that is cut in advance into a defined size. On one of main surfaces of the sheet base 110, adhesive is uniformly applied to form a joining layer 109.

Figure 5A:
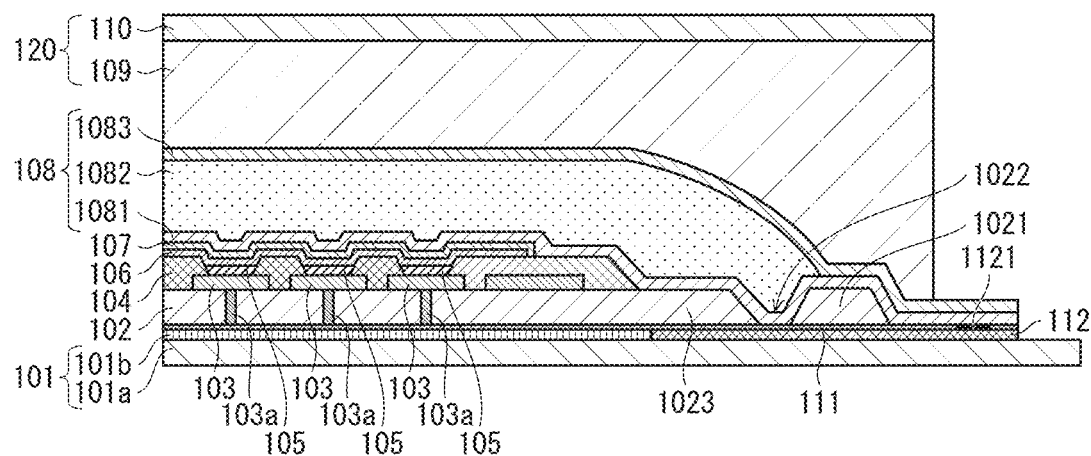
FIG. 5A and FIG. 5B are schematic cross-sectional views for describing processes of forming the organic EL display panel pertaining to at least one embodiment, continuing from FIG. 4C.
Figure 5B:
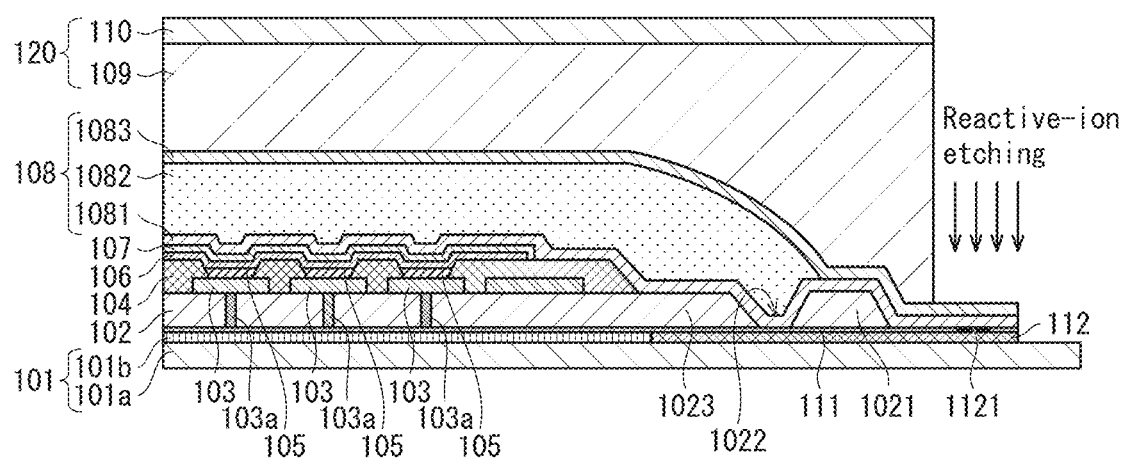

The sheet base 110 is positioned relative to the sealing layer 108 with the main surface on which the adhesive for the joining layer 109 is applied facing the sealing layer 108, placed on the sealing layer 108, and bonded to the sealing layer 108 through, for example, vacuum-pressure bonding (step S9, FIG. 5A).

Here, simultaneously with or after the vacuum-pressure bonding, a process of curing the joining layer 109 is performed. For example, the joining layer 109 is heated when the joining layer 109 has a thermosetting property; alternatively, the joining layer 109 is irradiated by using ultraviolet rays when the joining layer 109 has an ultraviolet-curing property. Due to this, the sealing reinforcement layer 120 is formed.

(9) Removing Peripheral Portion of Sealing Layer 108

Finally, portions of the peripheral portion of the sealing layer 108 in the peripheral region 20 that are outside the joining layer 109 are removed through reactive-ion etching (RIE) (step S10).

In the present embodiment, $SF_6$ (sulfur hexafluoride) and $O_2$ are used for reaction gas used in the RIE to selectively etch the first sealing layer 1081 and the third sealing layer 1083, which are made of silicon nitride. Here, the joining layer 109 and/or the sheet base 110 function as etching masks, and therefore it is not necessary to form an etching mask separately. Further, substances after reactions mainly change into gas (silicon tetrafluoride: $SiF_4$), and therefore no washing process needs to be performed after the RIE. This helps to reduce production costs.

Alternatively, carbon tetrafluoride ($CF_4$) or argon (Ar) can be used for the reaction gas described above.

Through the processes described above, the organic EL display panel 100 having a laminate structure in FIG. 2 is completed.

4. Effects

The first embodiment described above has the following effects.

(1) The interlayer insulating layer 102, which is made of resin and absorbs moisture easily, is covered by the first sealing layer 1081 and the third sealing layer 1083, which are made of an inorganic material that does not absorb moisture, up to the outer end of the interlayer insulating layer 102. This helps to effectively prevent moisture penetration from a direction along the substrate 101.

(2) The interlayer insulating layer 102 is divided completely by the peripheral groove 1022 into the outer insulating layer 1021 and the inner insulating layer 1023, and inner side surfaces and the bottom of the peripheral groove 1022 are covered by the first sealing layer 1081. Accordingly, even when moisture penetrates into the outer insulating layer 1021, the moisture is blocked by the peripheral groove 1022 and the first sealing layer 1081 and does not penetrate into the inner insulating layer 1023 easily.

(3) The joining layer 109 extends up to the outer ends of the first sealing layer 1081 and the third sealing layer 1083 and covers the first sealing layer 1081 and the third sealing layer 1083 from above. Accordingly, even when the first sealing layer 1081 and/or the third sealing layer 1083 has a sealing flaw such as a pinhole, the joining layer 109 suppresses direct contact of moisture to the first sealing layer 1081 and the third sealing layer 1083. This helps sealing property improvement.

(4) Similarly, because the joining layer 109 extends up to the outer ends of the first sealing layer 1081 and the third sealing layer 1083 and covers the first sealing layer 1081 and the third sealing layer 1083 from above, the close contact between the first sealing layer 1081 and the third sealing layer 1083 is maintained, and moisture would not penetrate from an interface between the first sealing layer 1081 and the third sealing layer 1083.

(5) Further, in the manufacturing processes, when removing unnecessary portions of the peripheral portions of the first sealing layer 1081 and the third sealing layer 1083 through RIE, the joining layer 109 functions as the etching mask. Accordingly, it is not necessary to form a new etching mask, which helps to reduce production costs.

Second Embodiment

1. Overview of Sealing Structure

The second embodiment differs from the first embodiment described above only with respect to the structure of the sealing reinforcement layer 120 in the sealing structure of the organic EL display panel 100. Accordingly, the following description focuses on structures particular to the second embodiment.

Figure 6:
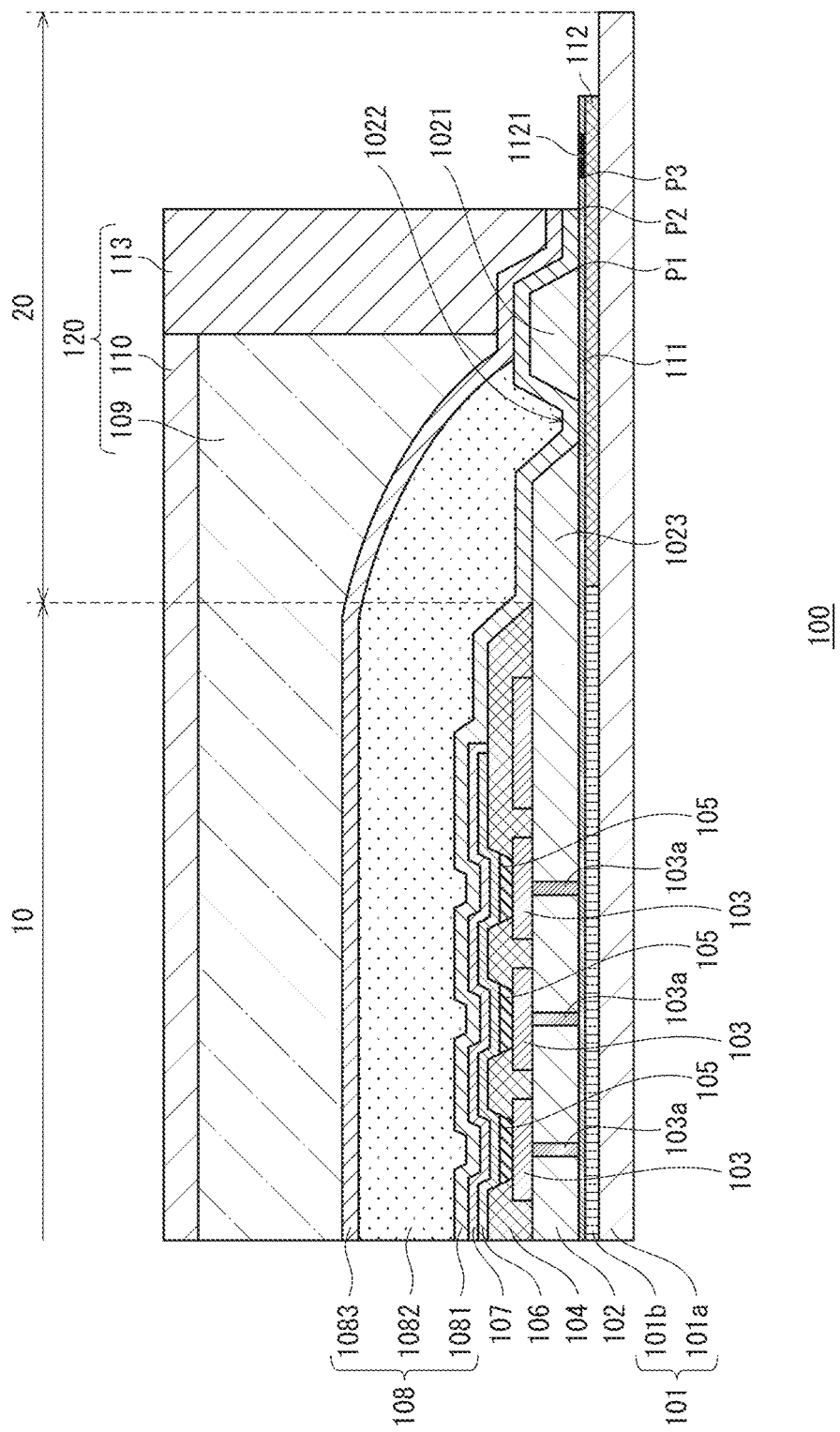
FIG. 6 is a schematic cross-sectional view of a laminate structure of an organic EL display panel pertaining to at least one embodiment of the present disclosure, taken along a line corresponding to line B-B in the region A of FIG. 1.

FIG. 6 is a schematic cross-sectional view of the laminate structure of the organic EL display panel 100 pertaining to at least one embodiment. In FIG. 6, the sealing reinforcement layer 120 includes: the sheet base 110; the joining layer 109; and a protection member 113 that covers ends of the sheet base 110 and the joining layer 109 and that is in close contact with an upper surface of the third sealing layer 1083. The protection member 113 protects outer ends of the joining layer 109 and the sheet base 110 and improves the sealing property. In plan view, the protection member 113 has a shape of a frame extending in parallel with the outer end of the sheet base 110.

The protection member 113 need not have a light-transmittance because the protection member 113 is located at the peripheral region 20. However, for the resin material of the protection member 113, a resin material having a tolerance for RIE is beneficial. Examples of such a resin material are an acrylic resin, a styrenic resin, a polycarbonate resin, an epoxy resin, a silicone resin, and the like that beneficially have a lower moisture-absorbing property than the material of the joining layer 109.

This structure helps to prevent moisture penetration from the outer end of the joining layer 109 effectively and to achieve sealing property improvement, and therefore helps to prevent deterioration of the organic EL elements in the image display region 10.

2. Manufacturing Method

The following describes a method of manufacturing the organic EL display panel 100 pertaining to the second embodiment, with reference to the drawings.

Figure 7:
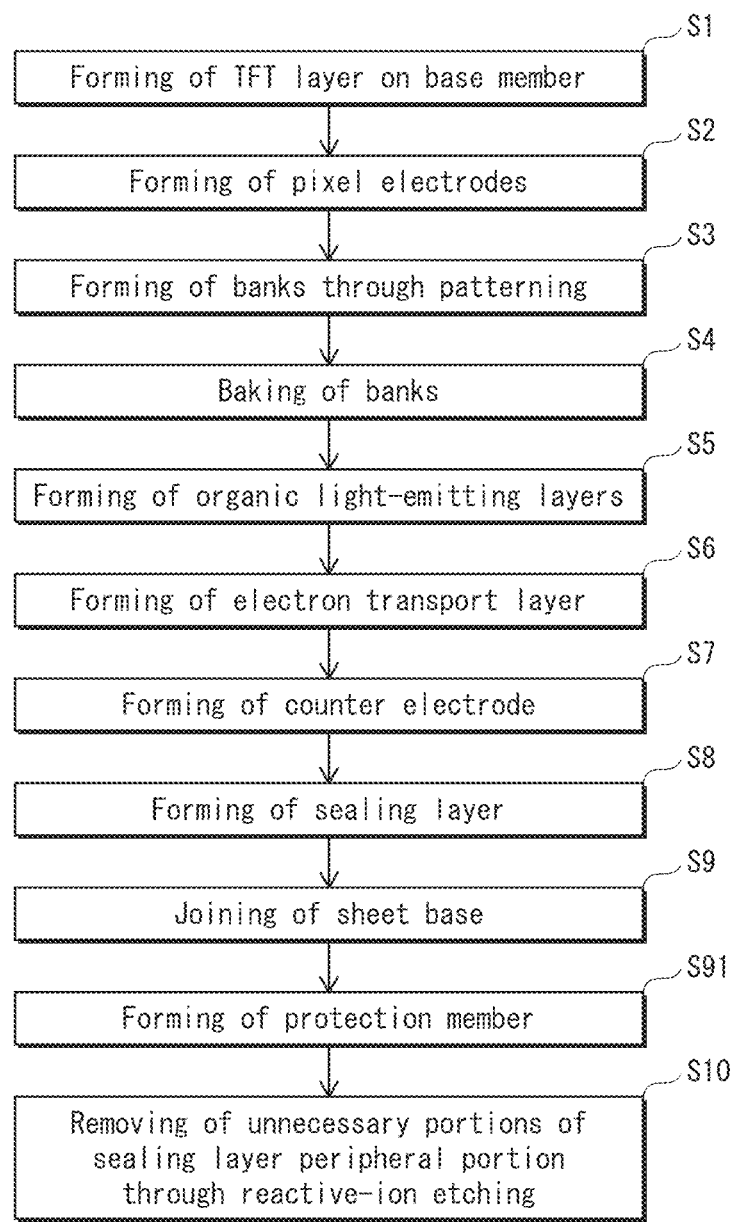
FIG. 7 is a flowchart of processes of forming the organic EL display panel pertaining to at least one embodiment in FIG. 6.

FIG. 7 is a flowchart of processes of manufacturing the organic EL display panel 100 pertaining to at least one embodiment. The processes of manufacturing the organic EL display panel 100 pertaining to the second embodiment differ from the processes in FIG. 3 in that a process of forming the protection member in step S91 is interposed between the process of joining the sheet base in step S9 and the process of removing the peripheral portions of the sealing layer in step S10.

Figure 8A:
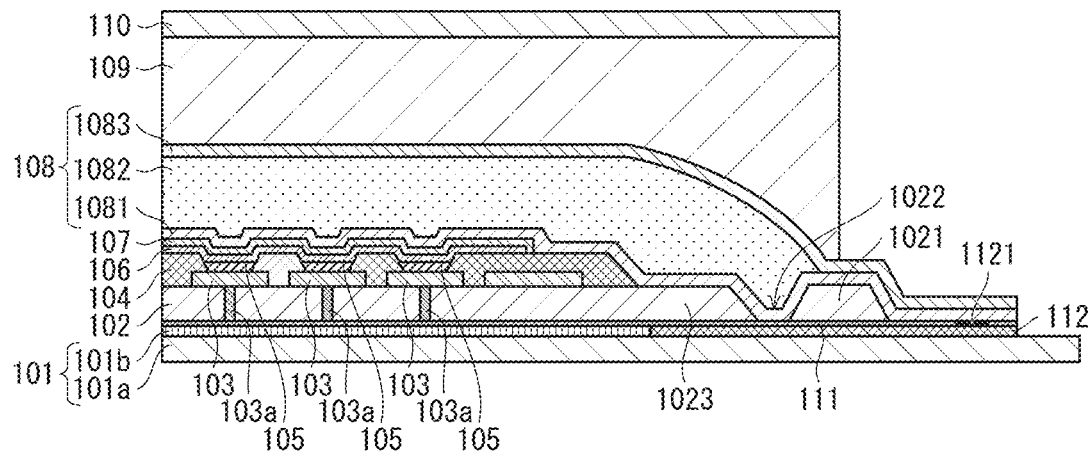
FIG. 8A.
Figure 8B:
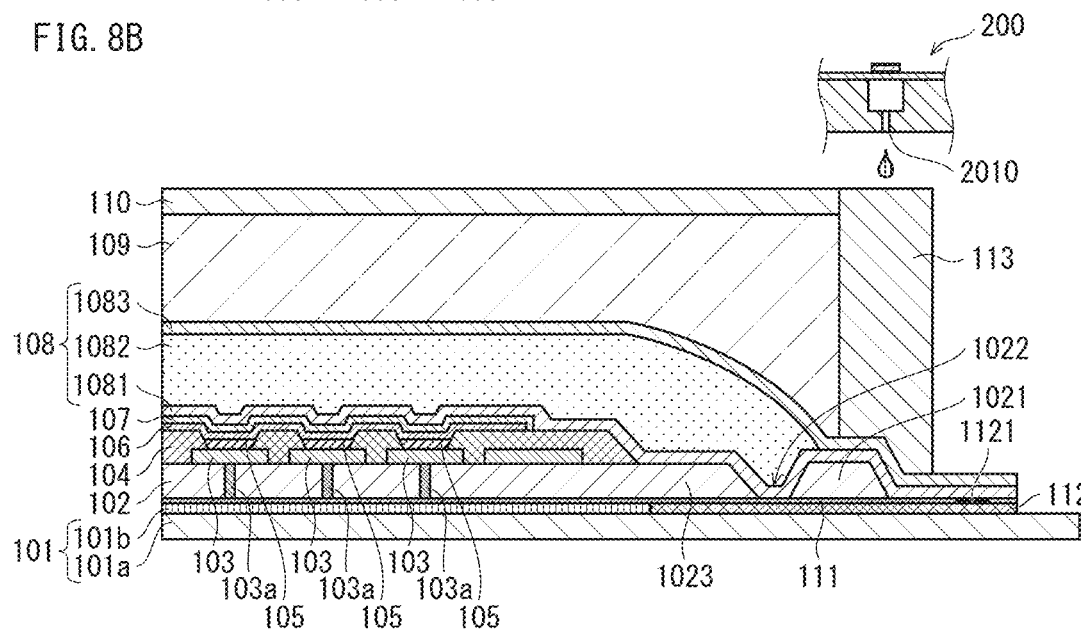
FIG. 8B, and FIG. 8C are schematic cross-sectional views for describing processes of forming the organic EL display panel pertaining to at least one embodiment in FIG. 6.

That is, in step S9, a sheet member 110 having a smaller size than in the first embodiment is joined to the sealing layer 108 through the joining layer 109 (FIG. 8A). In step S91, an uncured resin material is ejected from a nozzle 2010 of a head portion 200 of an inkjet device to a position in which the uncured resin material is in contact with the outer end of the joining layer 109 (FIG. 8B), and the resin material is cured. For example, the resin material is cured through heating when the resin material has a thermosetting property; alternatively, the resin material is cured through ultraviolet irradiation when the resin material has an ultraviolet-curing property.

The resin material of the protection member 113 when being applied has a greater viscosity than the resin material of the second sealing layer 1082 when being applied. Through curing immediately after application, the resin material of the protection member 113 would not deform.

Note that the resin material can be applied through screen printing, dispensing, or the like as an alternative to the inkjet process described above.

Figure 8C:
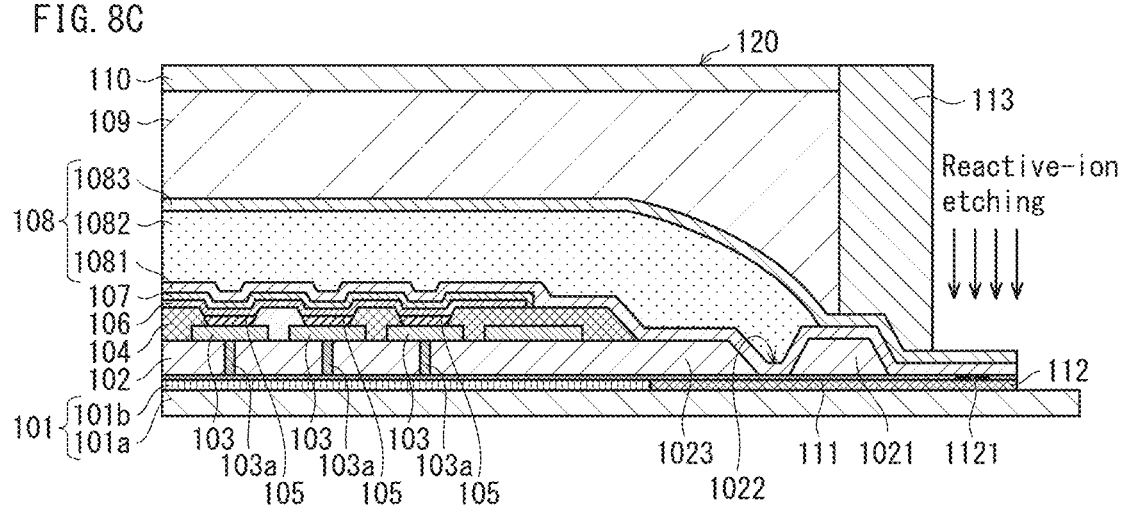

Finally, portions of the peripheral portion of the sealing layer 108 in the peripheral region 20 that are outside the protection member 113 are removed through RIE (step S10 FIG. 8C).

Here, the scaling reinforcement layer 120 functions as an etching mask, and therefore it is not necessary to form an etching mask separately. Further, substances after reactions mainly change into gas, and therefore no washing process needs to be performed after the RIE. This helps to reduce production costs.

Through the processes described above, the organic EL display panel 100 having a laminate structure in FIG. 6 is completed.

3. Effects

In the organic EL display panel 100 pertaining to the second embodiment described above, the outer ends of the joining layer 109 and the sheet base 110 are sealed by the protection member 113 that is independent from the joining layer 109 and the sheet base 110. In addition to the effects of the first embodiment, this structure helps to achieve greater sealing property improvement, and therefore helps to prevent deterioration of the organic EL elements in the image display region 10 more effectively.

<<Modifications>>

Embodiments and modifications described show beneficial examples of the present disclosure. Values, shapes, materials, components, component positions and connections, processes, process order, and the like illustrated by the embodiments are examples and can be appropriately changed without departing from the scope of the present disclosure.

The following describes other embodiments of the organic EL display panel pertaining to the present disclosure.

(1) According to the above embodiments, a wet film-forming process such as printing, spin coating, an inkjet process, or the like is used as a process of forming the light-emitting layers, but the present disclosure should not be construed as being limited to this. For example, a dry film-forming process can be used such as vacuum vapor deposition, electron beam deposition, sputtering, reactive sputtering, ion plating, a vapor phase growth process, or the like. Further, publicly-known materials may be appropriately used as materials of each component.

(2) In the above embodiments, the film-forming conditions and composition of the first sealing layer 1081 and the film-forming conditions and composition of the third sealing layer 1081 are the same. However, they need not necessarily be exactly the same, and may be appropriately changed by a skilled artisan.

Further, inorganic materials typically have a lower moisture absorbing property than resins, and therefore another appropriate inorganic material (such as silicon oxynitride (SiON), silicon carbide (SiC), or the like) may be used for a material of the first sealing layer 1081 and the third sealing layer 1083 instead of or in addition to silicon nitride (SiN) described above.

(3) In the above embodiments, the sheet base 110 made of a transparent resin film is joined to the sealing layer 108 to further improve the sealing property, but a known polarizing film made of a resin material may be used as the sheet base 110 (see, for example, Japanese Patent Application Publication H7-142170, Japanese Patent Application Publication 2001-004837, or the like).

The polarizing film helps to prevent light entering from the outside and reflected in the organic EL display panel 100 (specifically in the pixel electrodes 103) from being transmitted outside. This helps to improve visibility of the organic EL display panel 100 in outdoors or the like.

Further, in the above embodiments, organic materials each emitting a different one of the light-emitting colors R, G, and B are used for the light-emitting layers 105. However, a structure is possible in which an organic material only emitting white light is used and a known color filter substrate in which filters of the colors R, G, and B are arrayed is used as the sheet base 110.

(4) When the base member 101a is a flexible substrate made of resin as in the above embodiments, a structure in which a sealing film similar to the first sealing layer 1081 and the third sealing layer 1083 pertaining to the embodiments is disposed between the base member 101a and the TFT layer 101b is possible. This structure helps to suppress penetration of moisture from a substrate side.

(5) In the above embodiments, the organic EL elements each include a pixel electrode, a light-emitting layer, an electron transport layer, and a counter electrode. However, the organic EL elements may each include, between the pixel electrode and the light-emitting layer, a hole injection layer and/or a hole transport layer. Further, the organic EL elements may include, between the electron transport layer and the counter electrode, an electron injection layer.

Further, the present embodiment has a top-emission type structure in which the pixel electrodes are reflective electrodes and the counter electrode is a light-transmissive electrode. However, a bottom-emission type structure in which the pixel electrodes are light-transmissive electrodes and the counter electrode is a reflective electrode is possible.

(6) In the above embodiments, as in FIG. 2 and FIG. 6, both the outer peripheral portion of the first sealing layer 1081 and the outer peripheral portion of the third sealing layer 1083 extend up to the position P2 such that both the outer peripheral portion of the first sealing layer 1081 and the outer peripheral portion of the third sealing layer 1083 cover the top surface and outer side surfaces of the outer insulating layer 1021. However, a structure in which at least one of the first sealing layer and the third sealing layer covers the top surface and the outer side surfaces of the outer insulating layer 1021 helps to prevent moisture from easily penetrating from the outside into the outer insulating layer 1021.

(7) Further, in the above embodiments, the outer ends of the sheet base 110 and the joining layer 109 are in the same positions and the sizes of the sheet base 110 and the joining layer 109 are the same. However, the present disclosure should not be construed as being limited to this, the outer end of the sheet base 110 may be slightly outside the outer end of the joining layer 109, or the outer end of the sheet base 110 may be slightly inside the outer end of the joining layer 109.

(8) Further, the outer end of the joining layer 109 need not necessarily be at exactly the same position as the position P2 of the outer ends of the first sealing layer 1081 and the third sealing layer 1083 as in FIG. 2 and FIG. 6. Even when the position of the outer end of the joining layer 109 is not exactly the same as the position P2 of the outer ends of the first sealing layer 1081 and the third sealing layer 1083, the first sealing layer 1081 and the third sealing layer 1083 can be prevented from peeling from each other to some extent as long as an end of the joining layer 109 facing the first sealing layer 1081 holds down at least a part of portions in which the first sealing layer 1081 and the third sealing layer 1083 are in direct contact.

<<Supplement>>

Although an organic EL display panel and a manufacturing method thereof pertaining to the present disclosure have been fully described by way of one or more embodiments and modifications with reference to the accompanying drawings, it is to be noted that various changes and modifications will be apparent to those skilled in the art. Therefore, unless such changes and modifications and one or more embodiments that are achieved through combining elements and functions of embodiments and modifications depart from the scope of the present disclosure, they should be construed as being included therein.

The invention claimed is:

1. An organic electroluminescence (EL) display panel having an image display region and a peripheral region around the image display region in plan view, the organic EL display panel comprising:
   a substrate;
   an insulating resin layer disposed above the substrate and extending from the image display region to the peripheral region;
   an organic EL element array disposed above the insulating resin layer within the image display region;
   a sealing layer disposed above the organic EL element array and extending from the image display region to the peripheral region; and
   a sealing reinforcement layer laminated above the sealing layer, wherein
   the sealing layer includes a first sealing layer, a second sealing layer, and a third sealing layer that are laminated in this order from the substrate, the first sealing layer and the third sealing layer each being made of an inorganic material and the second sealing layer being made of a resin,
   in an outer peripheral portion of the sealing layer, the first sealing layer and the third sealing layer are in direct contact with each other without the second sealing layer disposed therebetween and extend to cover an outer end of the insulating resin layer, and
   an outer end of the sealing reinforcement layer is located outside the outer end of the insulating resin layer in plan view, wherein
   the sealing reinforcement layer includes a sheet-like base, a joining layer through which the sheet-like base is joined to the sealing layer, and a protection member that covers an outer end of the joining layer and an outer end of the sheet-like base.

2. The organic EL display panel of claim 1, wherein the protection member is made of an ultraviolet-curing resin material or a thermosetting resin material.

3. The organic EL display panel of claim 1, wherein in plan view, outer ends of the first sealing layer and the third sealing layer coincide with the outer end of the sealing reinforcement layer.

4. An organic electroluminescence (EL) display panel having an image display region and a peripheral region around the image display region in plan view, the organic EL display panel comprising:
   a substrate;
   an insulating resin layer disposed above the substrate and extending from the image display region to the peripheral region;
   an organic EL element array disposed above the insulating resin layer within the image display region;
   a sealing layer disposed above the organic EL element array and extending from the image display region to the peripheral region; and
   a sealing reinforcement layer laminated above the sealing layer, wherein
   the sealing layer includes a first sealing layer, a second sealing layer, and a third sealing layer that are laminated in this order from the substrate, the first sealing layer and the third sealing layer each being made of an inorganic material and the second sealing layer being made of a resin,
   in an outer peripheral portion of the sealing layer, the first sealing layer and the third sealing layer are in direct contact with each other without the second sealing layer disposed therebetween and extend to cover an outer end of the insulating resin layer, and
   an outer end of the sealing reinforcement layer is located outside the outer end of the insulating resin layer in plan view, wherein
   the insulating resin layer has, in the peripheral region, a groove that surrounds the organic EL element array,
   the insulating resin layer is divided into an inner insulating resin layer portion and an outer insulating resin layer portion by the groove, and
   the first sealing layer covers side surfaces and a bottom of the groove and the outer insulating resin layer portion.

5. The organic EL display panel of claim 4, wherein the sealing reinforcement layer includes a sheet-like base and a joining layer through which the sheet-like base is joined to the sealing layer.

\* \* \* \* \*